(12) United States Patent
Margavio et al.

(10) Patent No.: US 10,882,130 B2
(45) Date of Patent: Jan. 5, 2021

(54) CERAMIC-ALUMINUM ASSEMBLY WITH BONDING TRENCHES

(71) Applicant: Watlow Electric Manufacturing Company, St. Louis, MO (US)

(72) Inventors: Patrick Margavio, Columbia, MO (US); Kurt English, Columbia, MO (US); Jacob Wilson, St. Charles, MO (US); Miranda Pizzella, St. Louis, MO (US); Todd Brooke, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 85 days.

(21) Appl. No.: 15/955,431

(22) Filed: Apr. 17, 2018

(65) Prior Publication Data

US 2019/0314918 A1  Oct. 17, 2019

(51) Int. Cl.
*B32B 15/00* (2006.01)
*B23K 1/19* (2006.01)
*C04B 35/645* (2006.01)
*H01L 21/683* (2006.01)

(52) U.S. Cl.
CPC ............ *B23K 1/19* (2013.01); *C04B 35/645* (2013.01); *H01L 21/6831* (2013.01); *C04B 2235/945* (2013.01); *C04B 2237/343* (2013.01); *C04B 2237/366* (2013.01); *C04B 2237/50* (2013.01)

(58) Field of Classification Search
None
See application file for complete search history.

(56) References Cited

U.S. PATENT DOCUMENTS

| 4,871,107 A | 10/1989 | Yamada et al. |
| 5,234,152 A | 8/1993 | Glaeser |
| 5,985,464 A * | 11/1999 | Schmitt .............. B22D 19/04 228/120 |
| 6,315,188 B1 | 11/2001 | Cadden et al. |
| 6,644,394 B1 | 11/2003 | Kraft et al. |
| 7,073,703 B2 | 7/2006 | Takahashi et al. |
| 7,270,888 B2 | 9/2007 | De La Prieta et al. |
| 7,854,975 B2 | 12/2010 | Fujii |
| 8,164,909 B2 | 4/2012 | Nagase et al. |
| 8,684,256 B2 | 4/2014 | Elliot et al. |
| 8,789,743 B2 | 7/2014 | Elliot et al. |

(Continued)

FOREIGN PATENT DOCUMENTS

EP  0726239  8/1996

OTHER PUBLICATIONS

International Search Report for International Application PCT/US2019/025930, dated Jun. 25, 2019.

(Continued)

*Primary Examiner* — Seth Dumbris
*Assistant Examiner* — Kim S. Horger
(74) *Attorney, Agent, or Firm* — Burris Law, PLLC (57) ABSTRACT

An assembly includes a first member, a second member adjacent to the first member, and an aluminum material. At least one of the first member and the second member defines at least one trench. The aluminum material is disposed within the trench and bonds the first member to the second member along adjacent faces. In one form, a spacing between the first member and the second member along the adjacent faces is less than 5 μm.

20 Claims, 6 Drawing Sheets

(56) References Cited

U.S. PATENT DOCUMENTS

| | | |
|---|---|---|
| 8,932,680 B2 | 1/2015 | Ishii et al. |
| 8,932,690 B2 | 1/2015 | Elliot et al. |
| 9,315,424 B2 | 4/2016 | Elliot et al. |
| 9,556,074 B2 | 1/2017 | Elliot et al. |
| 9,624,137 B2 | 4/2017 | Elliot et al. |
| 2006/0156528 A1* | 7/2006 | Esaki ............... B32B 18/00 29/428 |
| 2006/0182908 A1 | 8/2006 | Fujii |
| 2008/0314320 A1 | 12/2008 | Balma et al. |
| 2010/0177454 A1 | 7/2010 | Elliot et al. |
| 2011/0288648 A1 | 11/2011 | Joseph et al. |
| 2013/0180976 A1 | 7/2013 | Elliot et al. |
| 2013/0181038 A1 | 7/2013 | Elliot et al. |
| 2013/0186940 A1 | 7/2013 | Elliot et al. |
| 2013/0189022 A1 | 7/2013 | Elliot et al. |
| 2013/0250471 A1 | 9/2013 | Rex |
| 2014/0014642 A1 | 1/2014 | Elliot et al. |
| 2014/0014710 A1 | 1/2014 | Elliot et al. |
| 2014/0197227 A1 | 7/2014 | Elliot et al. |
| 2015/0108203 A1 | 4/2015 | Elliot et al. |
| 2015/0259253 A1 | 9/2015 | Fellows et al. |
| 2016/0184912 A1 | 6/2016 | Elliot et al. |
| 2016/0185672 A1 | 6/2016 | Elliot et al. |
| 2017/0072516 A1 | 3/2017 | Elliot et al. |
| 2017/0240475 A1 | 8/2017 | Elliot et al. |
| 2017/0263486 A1 | 9/2017 | Elliot et al. |

OTHER PUBLICATIONS

Zhu, et al., Joining of AlN ceramic to metals using sputtered Al or Ti film, Journal of Materials Processing Technology, vol. 109, pp. 277-282, Elsevier Science, B.V., 2001.

Lin, et al., Low-Cost Direct Bonded Aluminum (DBA) Substrates, 2013 Vehicle Technology Annual Merit Review and Peer Evaluation Meeting May 14, 2013.

Nicholas, et al., Some observations on the wetting and bonding of nitride ceramics, Journal of Materials Science, vol. 25, pp. 2679-2689, 1990.

Rhee, S.K., Wetting of Ceramics by Liquid Aluminum, Journal of American Ceramic Society, vol. 53, No. 7, Jul. 1970.

Shen, et al., Critical Factors Affecting the Wettability of a-Alumina by Molten Aluminum, J. Am. Ceram. Soc., vol. 87 (11), pp. 2151-2159, Nov. 2004.

\* cited by examiner

CERAMIC-ALUMINUM ASSEMBLY WITH BONDING TRENCHES

FIELD

The present disclosure relates generally to methods of joining objects, and more particularly to methods of joining ceramic materials and the resulting joined assemblies.

BACKGROUND

The statements in this section merely provide background information related to the present disclosure and may not constitute prior art.

Support pedestals are often used in semiconductor processing. A support pedestal typically includes a plate member for supporting a wafer thereon and a tubular shaft disposed under the plate member. The plate member may include a ceramic substrate and a plurality of functional elements, such as a heating element, embedded in the ceramic substrate.

The ceramic substrate may be formed by hot pressing. Hot pressing is a high-pressure, low-strain process to enhance densification of powder or compacted preform at high temperature. Typically, the powder or the compacted preform is put into a mold, and high temperatures and pressure are applied for densification and sintering.

The functional elements that are embedded in the ceramic substrate must withstand high heat and high pressure in the hot pressing process. Therefore, the materials for forming the functional elements are limited. Moreover, hot pressing requires high temperature and high pressure equipment, thereby increasing manufacturing costs.

In some cases, two or more ceramic substrates may be bonded together by brazing. However, the brazed joint is not without problems due to poor wettability of the ceramic materials as well as the incompatible coefficient of thermal expansion (CTE) between the brazing metals and the ceramic materials. Cracks or delamination may occur between the brazing metals and the ceramic substrates at elevated temperatures due to their significantly different thermal expansions.

These challenges, among other challenges, in manufacturing ceramic support pedestals are addressed by the present disclosure.

SUMMARY

In one form, an assembly is provided, which includes a first member, a second member adjacent to the first member, and an aluminum material. At least one of the first member and the second member defines at least one trench. The aluminum material is disposed within the trench and bonds the first member to the second member along adjacent faces. A spacing between the first member and the second member along the adjacent faces is less than 5 µm.

In another form, a method of bonding is provided, which includes: preparing a first member; preparing a second member; forming at least one trench in at least one of the first member or the second member; placing a strip of solid aluminum material between the first member and the second member across the trench; bringing the first member and the second member together to contact the solid aluminum material and to form an assembly; applying a force and heat to the assembly above a melting point of the solid aluminum material such that the solid aluminum material flows into the trench; applying additional heat to the assembly at or above a wetting temperature of the member in which the trench is formed to bond the first member to the second member along adjacent faces; and cooling the assembly. A spacing between the first member and the second member along the adjacent faces is less than 5 µm.

In still another form, an assembly is provided, which includes a first ceramic member, a second ceramic member disposed adjacent to the first member, and an aluminum material. At least one of the first ceramic member and the second ceramic member defines a plurality of trenches spaced a distance apart less than 2 mm. The aluminum material is disposed within the plurality of trenches and bonds the first ceramic member to the second ceramic member along adjacent faces. A spacing between the first member and the second member along the adjacent faces is less than 5 µm.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The present disclosure will become more fully understood from the detailed description and the accompanying drawings, wherein:

FIGS. 5A to 5E depict the steps of bonding materials using the method of FIG. 4, wherein:

Corresponding reference numerals indicate corresponding parts throughout the several views of the drawings.

DETAILED DESCRIPTION

The following description is merely exemplary in nature and is not intended to limit the present disclosure, application, or uses.

Figure 1:
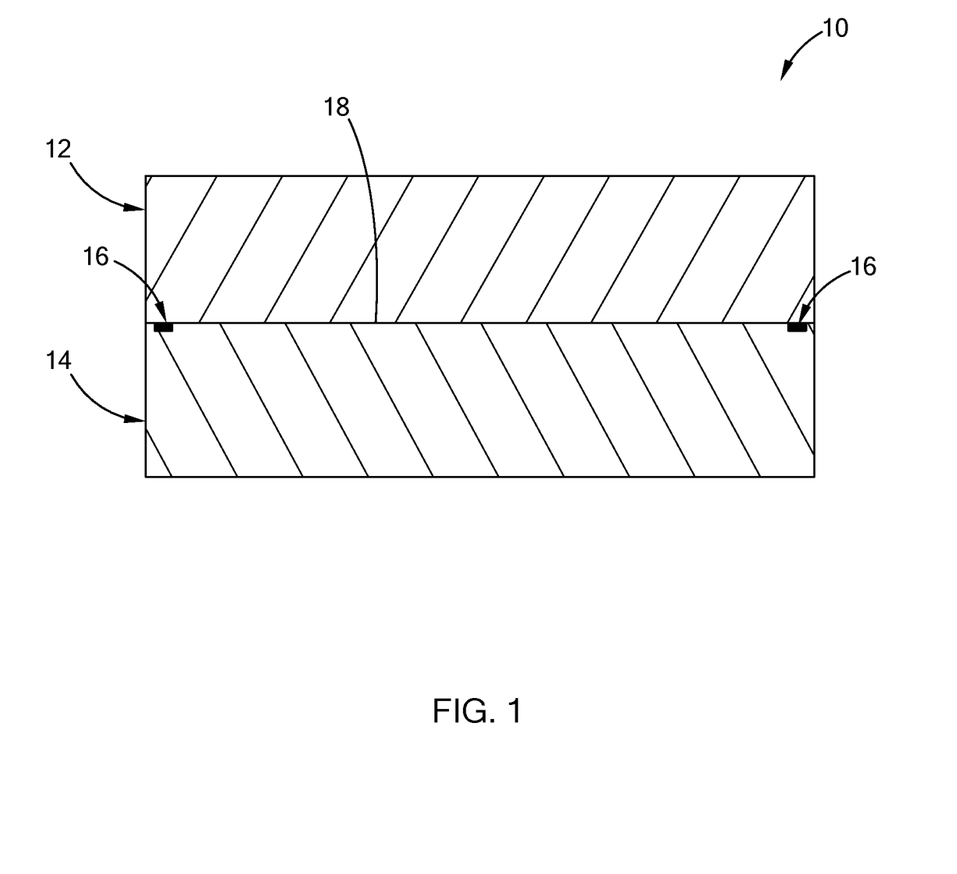
FIG. 1 is a cross-sectional view of a joined assembly constructed in accordance with the teachings of the present disclosure.

Referring to FIG. 1, a joined assembly 10 constructed in accordance with the teachings of the present disclosure includes a first member 12 and a second member 14 bonded by aluminum material 16 along a periphery of the first and second members 12, 14. The first member 12 and the second member 14 may be made of ceramic materials, such as aluminum nitride (AlN), alumina, zirconia, and silicon carbide (SiC). When the joined assembly 10 is used to form a support pedestal in semiconductor processing, both the first member 12 and the second member 14 may be made of aluminum nitride (AlN) and functional layers (not shown) may be disposed at the interface between the first and second members 12, 14.

The first and second members 12, 14 in this form each have a plate configuration and define adjacent faces 18 facing each other. In one form, the adjacent faces 18 have a surface flatness of less than 5 μm, and a surface roughness of less than 3 μm. In one application, the surface roughness of the adjacent faces 18 may be in the range between 100 nm and 5 μm. A spacing between the first member 12 and the second member 14 along the adjacent faces is less than 5 μm in one form of the present disclosure.

Figure 2:
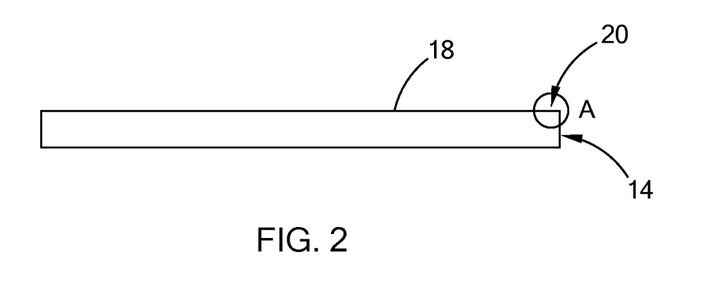
FIG. 2 is a side view of a second member of the joined assembly of FIG. 1.
Figure 3:
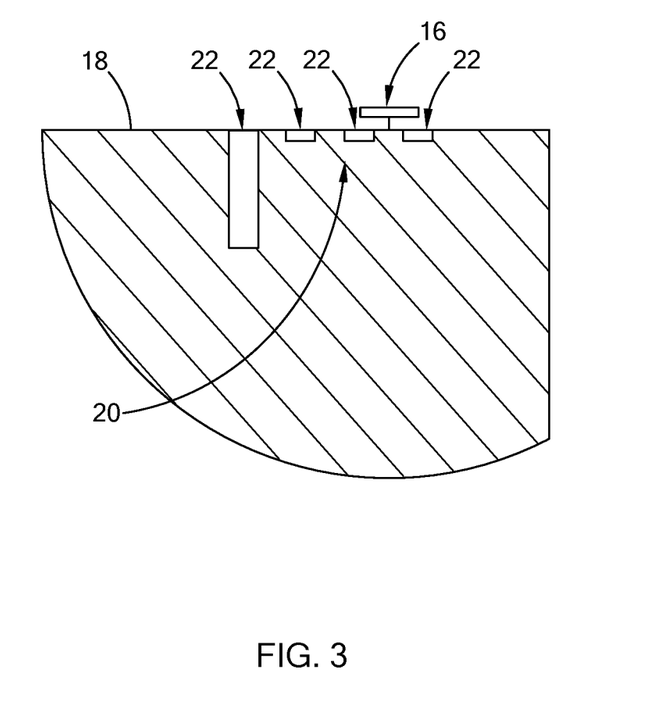
FIG. 3 is an enlarged view of portion A of FIG. 2.

Referring to FIGS. 2 and 3, at least one of the first and second members 12, 14 define a bonding feature 20 along its periphery and on the adjacent face 18. The bonding feature 20 may be in the form of one or more trenches 22 as shown. The aluminum material 16 is filled in the trenches 22 as described in greater detail below. One of the trenches 22 that is closer to a center of the second member 14 may be deeper than the other trenches 22. While a total of four trenches 22 are shown in the second member 14 in the illustrated form, the bonding feature 20 can have any number of trenches and can be formed in the first member 12 and/or the second member 14 without departing from the scope of the present disclosure. Further, the trenches 22 may take any path along each of the first and/or second members 12, 14 depending on application requirements, which may be circular, sinuous, or linear, among other paths and at least one trench 22 of one or more trenches 22 defines at least one of a square, rectangular, arcuate, and polygonal cross-sectional geometry.

In FIG. 3, the solid aluminum material 16 is depicted to show the position of the solid aluminum material 16 relative to the trenches 22 when the solid aluminum material 16 is placed between the first member 12 and the second member 14. In this form, the solid aluminum material 16 is placed to overlap the two outermost trenches 22. In this form, the deepest trench that is closer to the center of the second member 14 functions to restrict the molten aluminum material from flowing toward the center and outside the bonding area.

When a plurality of trenches 22 are formed, the plurality of trenches 22 may be configured parallel to each other and are spaced at a distance apart less than 2 mm. Making the trenches 22 closer to each other can reduce the size of the bonding area to less than 2 mm. A smaller bonding area has the advantages of reducing the area that needs to be heated to the wetting temperature and achieving uniform heating in the bonding area during the bonding process, which will be described in more detail below. Moreover, the smaller bonding area reduces the risk of aluminum flowing into adjacent area where functional elements such as vias, routing circuits, terminations, among others, are disposed. The trenches 22 are also configured limit the flow of aluminum, or other bonding material that may be used besides aluminum, in the bonding area.

In one form, the number of the trenches 22 is at least three or at least five. The aspect ratio (i.e., the width/depth) of each of the trenches 22 is between 5 to 20. In other words, the width of each trench is between 5 and 20 times the depth of each trench 22. A shallower trench 22 contributes to a desired hermeticity of less than $10^{-9}$ mbar-l/sec. The width of the bonding area may be less than 3 mm. The depth of the trenches 22 is less than 50 μm, and in one form less than 20 μm to reduce thermal stress due to differences in thermal expansion between the bonding material (i.e., aluminum) and the ceramic member (i.e., AlN). When a deeper trench (e.g., larger than 100 μm) is used, the trench 22 should be made wider in order to achieve the required hermeticity.

When the first and second members 12, 14 are circular members, the plurality of trenches 22 are configured to have an annular shape along the periphery of the first and second members 12, 14. However, the shape (or path) of the trenches 22 may vary according to application requirements and may further be of a varying width (rather than a constant width as illustrated herein) while remaining within the scope of the present disclosure.

Figure 4:
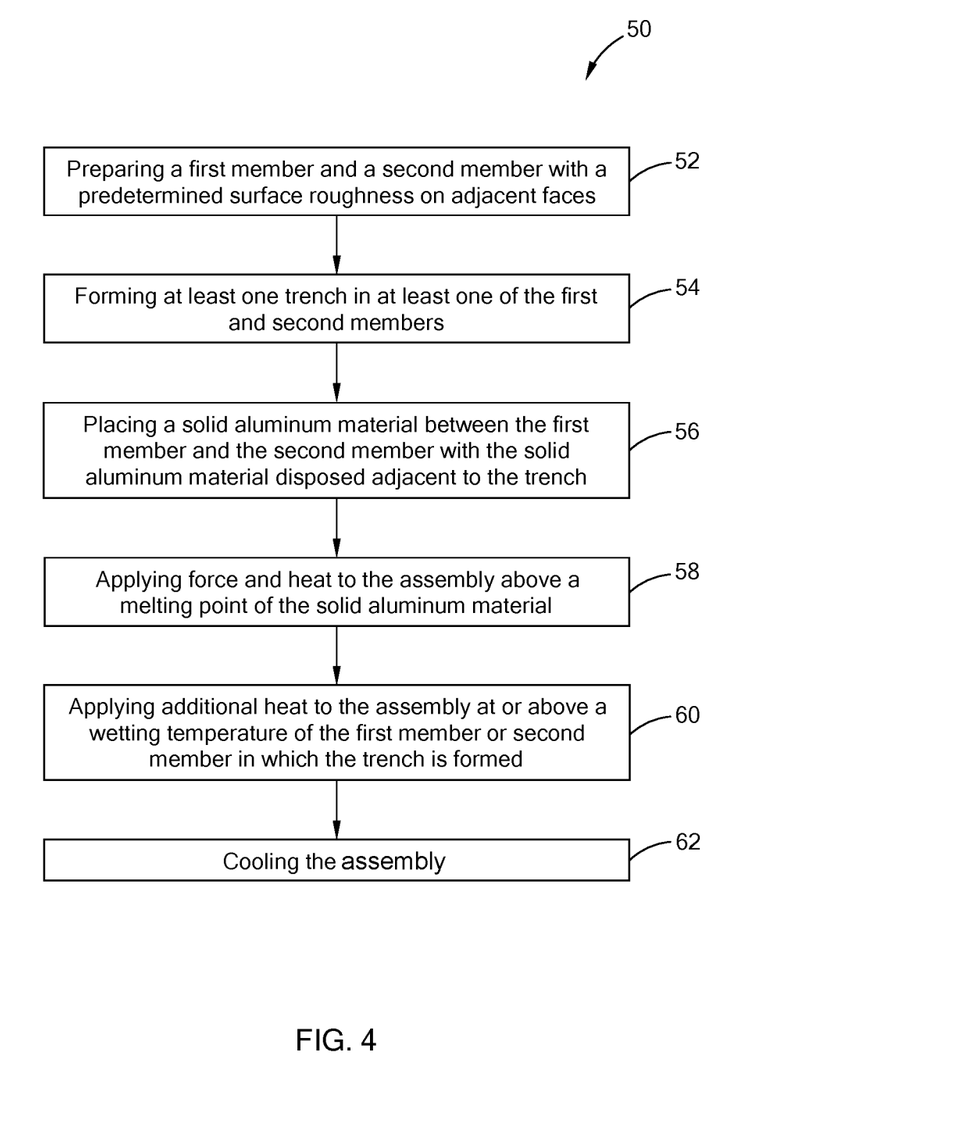
FIG. 4 is a flow diagram of a method of bonding materials in accordance with the teachings of the present disclosure.

Referring now to FIG. 4, a method 50 of joining materials, particularly ceramic materials, to make the joined assembly 10 of FIG. 1 starts with preparing a first member 12 and a second member 14 with a predetermined surface roughness in adjacent faces 18 in step 52. The first member 12 and the second member 14 may be made of aluminum nitride (AlN), alumina, zirconia, and silicon carbide (SiC). The adjacent faces 18 of the first and second members each have a surface roughness between 100 nm and 5 μm.

Figure 5A:
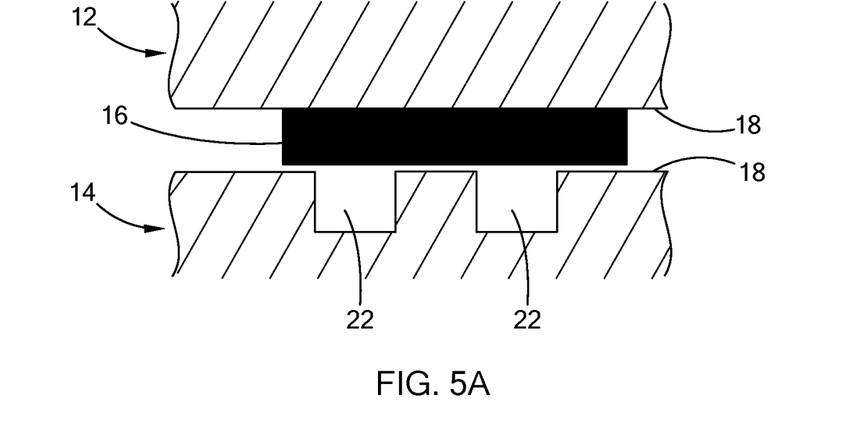
FIG. 5A depicts a step of placing a solid aluminum material between a first member and a second member.

Next, at least one trench 22 is formed in the adjacent face 18 of at least one of the first and second members 12, 14 in step 54. Referring to FIG. 5A, the first member 12 and the second member 14 are disposed adjacent each other with a solid aluminum material disposed therebetween in step 56. The solid aluminum material may be an aluminum foil and disposed adjacent to the at least one trench 22. This step is performed at room temperature. Alternatively, the aluminum material may be sputtered into the at least one trench 22, such as by physical vapor deposition (PVD).

Figure 5B:
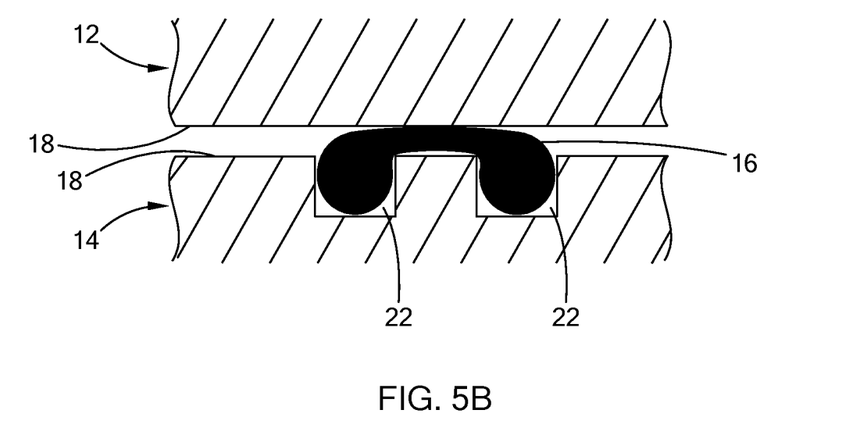
FIG. 5B depicts a step of melting solid aluminum material and causing the molten aluminum material to flow into trenches of the second member.
Figure 5C:
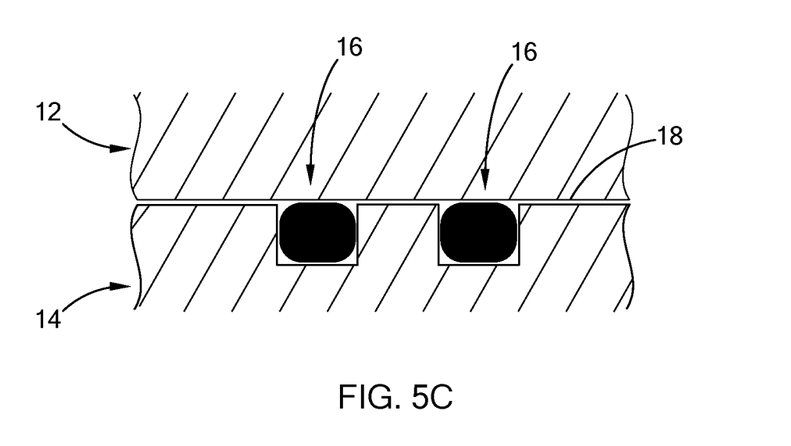
FIG. 5C depicts a step of pressing the first member and the second member against each other to reduce the spacing therebetween.

Thereafter, force and heat is applied to the assembly of the first and second members 12, 14 and the solid aluminum material above a melting point of the solid aluminum material in step 58. The melting point of the solid aluminum material is approximately 660° C. The force is applied on the first and second members 12, 14 to press the first and second members against each other. In this step, the solid aluminum material is melted and the molten aluminum material flows into the trenches 22 as shown in FIG. 5B. As force continues to be applied on the first and second members 12, 14, the spacing between the first and second members 12, 14 is reduced until most of the molten aluminum material is disposed in the trenches 22. However, as shown in FIG. 5C, the molten aluminum material balls up and does not conform to the geometry of the trench wall due to poor wettability of the ceramic material of the first or second members 12, 14. In one form, a spacing between the first member 12 and the second member 14 along the adjacent faces 18 is less than 5 μm.

The heat can be applied locally to the bonding area of the first and second members 12, 14 to reduce the risks of damaging the functional elements disposed at other areas of the first and second members 12, 14.

Figure 5D:
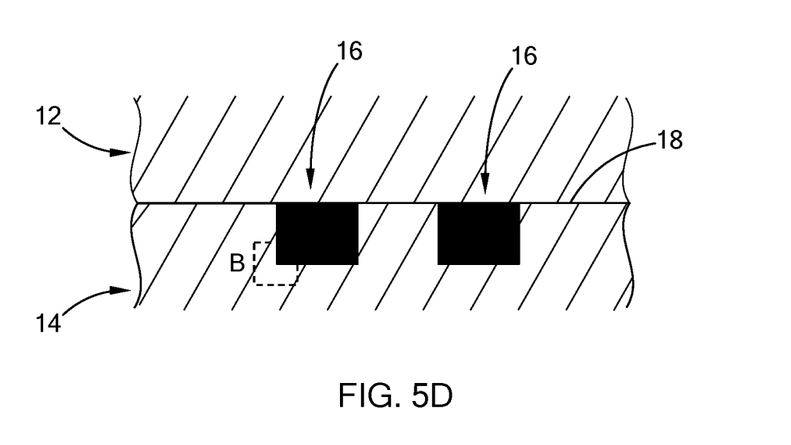
FIG. 5D depicts a step of heating the assembly to a temperature above a wetting temperature so that the molten aluminum material conforms to the geometry of the trenches.

Next, additional heat is applied to the assembly at or above a wetting temperature of the first member 12 or second member 14 where the trench 22 is formed to bond the first member 12 to the second member 14 along adjacent faces 18 in step 60. For aluminum nitride, the wetting temperature is above 850° C. In this step, alumina native oxide is broken in order to achieve wettability of the ceramic material. Wettability of the ceramics can be achieved when a purity of aluminum is greater than or equal to about 97%, the temperature is above about 800° C., the pressure is about 0.1 MPa to 6.5 MPa and a vacuum condition is approximately $10^{-3}$ Torr and below a vacuum level. Vacuum level and temperature are balanced to achieve wettability according to the teachings of the present disclosure. Wettability can be achieved at $10^{-3}$ Torr and at temperature of 1100° C., or at $10^{-6}$ Torr and at a temperature of 800° C. When the thermal process is performed between 1 to 10 hours, the aluminum begins to diffuse into the aluminum nitride to conform to the geometry of the aluminum nitride. Therefore, the molten aluminum material is shaped to conform to the geometry of the trenches 22 as shown in FIG. 5D, even on a micro-scale, due to wetting between the molten aluminum material and the trench wall of the first member 12 or the second member 14.

Similarly, the additional heat can be applied locally to the bonding area, rather than the entire assembly, to reduce the risks of damaging the functional elements disposed at other areas of the first and second members 12, 14.

Figure 5E:
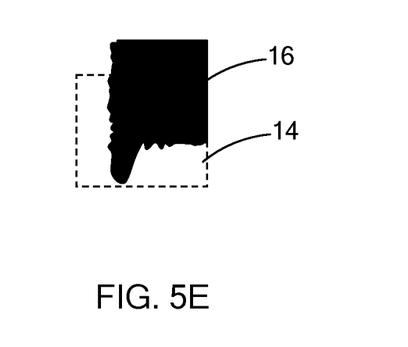
FIG. 5E is an enlarged view of portion B of FIG. 5D.

As shown in FIG. 5E, molten aluminum material has good wettability so that aluminum can be used to bond two ceramic materials, particularly aluminum nitride (AlN) together to create a hermetic bonding therebetween.

After the first member 12 is bonded to the second member 14, the assembly is cooled in step 62.

Figure 6:
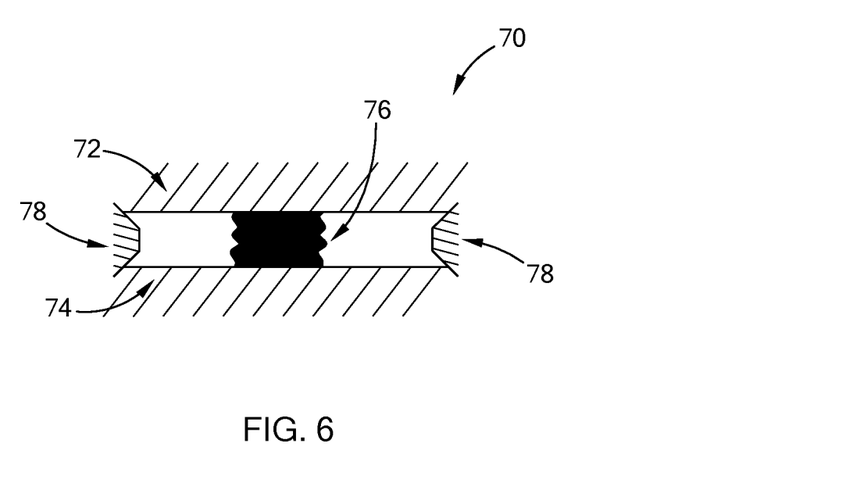
FIG. 6 is a schematic view of a variant of a joined assembly constructed in accordance with the teachings of the present disclosure.

Referring to FIG. 6, a variant of a bonded assembly 70 constructed in accordance with the teachings of the present disclosure may include a first member 72 and a second member 74 bonded by an aluminum material 76 via direct surface to surface bonding without forming any trench in the first member 72 or the second member 74. The first and second members 72, 74 are temporarily spaced apart by shims 78 in this form prior to bonding, and the aluminum material 76 has a width greater than 2 mm to achieve hermeticity.

Figure 7:
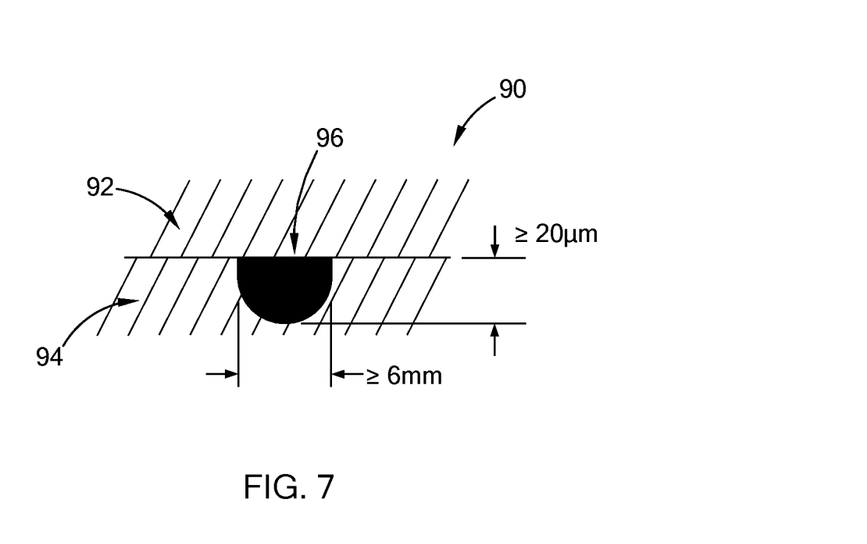
FIG. 7 is a schematic view of another variant of a joined assembly constructed in accordance with the teachings of the present disclosure.

Referring to FIG. 7, another variant of a joined member 90 constructed in accordance with the teachings of the present disclosure may include a first member 92, a second member 94, and an aluminum material 96 filled in a single trench of one of the first and second member 92, 94. When one single trench is used, which is arcuate in this form, the trench should have a width larger than 6 mm and the depth larger than 20 μm in order to achieve hermeticity.

It should be understood that the trenches may take on any shape other than those illustrated herein, including by way of example, tapered (inwardly or outwardly), dovetail, or polygonal, among other shapes. Also, the "width" of the trench as used and claimed herein refers to the maximum dimension across the trench for any given geometrical shape of the trench, such as the arcuate shape in FIG. 7. Further, the trenches may further include corner radii at an intersection with a surface of the member in which the trench is formed while remaining within the scope of the present disclosure.

With the bonding method of the present disclosure, ceramic materials can be relatively easily bonded. This method can be used to manufacture a ceramic pedestal in semiconductor processing, however, other applications are contemplated according to the teachings of the present disclosure. Therefore, the various functional layers may be formed on a plurality of ceramic members and then joined together by aluminum materials to form the heating plate. Accordingly, high temperature and high pressure equipment for a hot pressing operation may not be needed to form a monolith substrate, thereby reducing the manufacturing costs.

Moreover, the bonding methods according to the present disclosure involve relatively lower temperatures and relatively lower pressures. As a result, a wider selection of materials is available for forming the various functional layers in the ceramic substrate. For example, a layered heater formed by a thick film, thin film, thermal spray, or sol-gel process may be applied on one of the first and second members before the first and second members are bonded together using the bonding method of the present disclosure. TiNiHf termination braze, Nickel termination plating, or Aremco® anchor paste may be applied on the first member and/or the second member before the first and second members are bonded using the method of the present disclosure.

The bonding methods can also be used to bond a heating plate to a tubular shaft of the support pedestal to provide thermocouple pocket isolation. The bonding method can be used to manufacture a thin (thickness between 10 and 50 mm) flat (surface roughness less than 10 μm) AlN heater assembly in a variety of applications including AlN electrostatic chuck assembly.

Further, a support pedestal manufactured by the bonding methods of the present disclosure allows for repair and replacement of the heating plate, thereby increasing the life of the support pedestal.

It should be noted that the disclosure is not limited to the form described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. An assembly comprising:
   a first member;
   a second member disposed adjacent to the first member, wherein at least one of the first member and the second member defines at least one trench, the at least one trench defining a depth and a width; and
   an aluminum material disposed within the trench and bonding the first member to the second member along adjacent faces,
   wherein a spacing between the first member and the second member along the adjacent faces is less than 5 μm, and the width of the at least one trench is between 5 and 20 times the depth of the at least one trench.

2. The assembly according to claim 1, wherein a surface roughness of the adjacent faces of the first and second members is between 5 μm and 100 nanometers.

3. The assembly according to claim 1, wherein the trench defines at least one of a square, rectangular, arcuate, and polygonal cross-sectional geometry.

4. The assembly according to claim 1 further comprising a plurality of trenches that are spaced a distance apart less than 2 mm.

5. The assembly according to claim 4, wherein the plurality of trenches are parallel to each other.

6. The assembly according to claim 1, wherein the first member and the second member are selected from the group consisting of aluminum nitride (AlN), alumina, zirconia, and silicon carbide (SiC).

7. The assembly according to claim 1, wherein each of the first member and the second member are each aluminum nitride (AlN).

8. The assembly according to claim 1, wherein each of the first member and the second member are each a flat plate.

9. The assembly according to claim 1, wherein the first member is a flat plate and the second member is a hollow shaft.

10. An assembly comprising:
a first ceramic member;
a second ceramic member disposed adjacent to the first ceramic member, wherein at least one of the first ceramic member and the second ceramic member defines a plurality of trenches spaced a distance apart less than 2 mm, the plurality of trenches each define a depth and a width, and the width of each trench is between 5 and 20 times the depth of each trench; and
an aluminum material disposed within the plurality of trenches and bonding the first ceramic member to the second ceramic member along adjacent faces,
wherein a spacing between the first ceramic member and the second ceramic member along the adjacent faces is less than 5 μm and a surface roughness of the adjacent faces of the first and second ceramic members is between 5 μm and 100 nanometers.

11. The assembly according to claim 10, wherein the first and second ceramic members are each aluminum nitride (AlN).

12. The assembly according to claim 10, wherein the plurality of trenches are parallel to each other.

13. The assembly according to claim 10, wherein the plurality of trenches is at least three.

14. The assembly according to claim 13, wherein the plurality of trenches is five.

15. The assembly according to claim 10, wherein at least one trench of the plurality of trenches defines at least one of a square, rectangular, arcuate, and polygonal cross-sectional geometry.

16. The assembly according to claim 10, wherein the first ceramic member and the second ceramic member are selected from the group consisting of aluminum nitride (AlN), alumina, zirconia, and silicon carbide (SiC).

17. The assembly according to claim 10, wherein each of the first ceramic member and the second ceramic member are each a flat plate.

18. The assembly according to claim 10, wherein the first ceramic member is a flat plate and the second ceramic member is a hollow shaft.

19. The assembly according to claim 10, wherein the aluminum material is a physical vapor deposited (PVD) aluminum material.

20. The assembly according to claim 10, wherein the aluminum material is aluminum foil.

* * * * *